United States Patent
Yamada

(10) Patent No.: US 6,246,179 B1
(45) Date of Patent: Jun. 12, 2001

(54) EMISSIVE ELEMENT AND DISPLAY DEVICE USING SUCH ELEMENT

(75) Inventor: Tsutomu Yamada, Gifu (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/451,457

(22) Filed: Nov. 30, 1999

(30) Foreign Application Priority Data

| Dec. 1, 1998 | (JP) | 10-341857 |
| Dec. 2, 1998 | (JP) | 10-341858 |
| Oct. 4, 1999 | (JP) | 11-283182 |
| Oct. 28, 1999 | (JP) | 11-307126 |

(51) Int. Cl.$^7$ .................................................. G09G 3/10
(52) U.S. Cl. ........................... 315/169.3; 315/169.1; 345/76; 345/92; 313/498; 313/506
(58) Field of Search .................. 315/169.3, 169.1; 313/500, 503, 504, 498, 506; 345/76, 92

(56) References Cited

U.S. PATENT DOCUMENTS

| 4,015,166 | * | 3/1977 | Ohshima et al. ...................... 313/503 |
| 5,550,066 | | 8/1996 | Tang et al. .............................. 437/40 |
| 5,684,365 | | 11/1997 | Tang et al. ........................... 315/169.3 |
| 5,742,129 | * | 4/1998 | Nagayama et al. ................... 315/167 |
| 6,072,450 | * | 6/2000 | Yamada et al. ......................... 345/76 |
| 6,091,382 | * | 7/2000 | Shioya et al. ........................... 345/76 |

FOREIGN PATENT DOCUMENTS

| 8234683 | 6/1996 | (JP) . |
| 8241047 | 6/1996 | (JP) . |
| 8241048 | 6/1996 | (JP) . |

\* cited by examiner

Primary Examiner—Haissa Philogene
(74) Attorney, Agent, or Firm—Cantor Colburn LLP

(57) ABSTRACT

An EL element (60) comprises an anode (61), a cathode (67), and an emissive element layer (66) interposed between the two electrodes. A TFT is connected to the anode (61) at its source electrode (33s). The peripheral portion of the anode (61) and the entire region over the TFT are covered with a planarizing insulating film (17), and a part of the exposed portion of the anode (61) is connected to the emissive element layer (66). According to the above arrangement, it is possible to prevent disconnection of the emissive element layer (66) which may be caused by an uneven surface created by the thickness of the anode (61), and to avoid formation of a short circuit between the anode (61) and the cathode (67).

49 Claims, 6 Drawing Sheets

EMISSIVE ELEMENT AND DISPLAY DEVICE USING SUCH ELEMENT

BACKGROUND OF THE INVENTION

1. Field of the Invention

The present invention relates to a display device using a self-luminous element, and particularly to a display device using an electroluminescence element and a thin-film transistor.

2. Description of the Related Art

In recent years, electroluminescence (referred to hereinafter as "EL") display devices comprising EL elements are regarded as devices that may replace CRT and LCD. Research has been conducted for the development of EL display devices using, for example, thin film transistors (referred to hereinafter as "TFT") as switching elements to drive the EL elements.

FIG. 1 shows a plan view of a possible configuration of an active type EL display device, and FIG. 2 shows a cross-sectional view taken along line II—II of FIG. 1.

As shown in FIG. 1, a TFT is disposed near a junction of a gate signal line 51 with gate electrodes 11 and a drain signal line 52. The drain of the TFT is connected to the drain signal line 52, and the gate of the TFT is connected to the gate signal line 51. Further, the source of the TFT is connected to the anode 81 of an EL element.

As shown in FIG. 2, a display pixel 110 is formed by sequentially laminating a TFT and an organic EL element on a substrate 10 which may be a substrate made of glass or synthetic resin, a conductive substrate, or a semiconductor substrate. When a conductive substrate or a semiconductor substrate is used as the substrate 10, an insulating film made of materials such as $SiO_2$ or SiN is deposited before the TFT is formed.

Gate electrodes 11 made of refractory metal such as chromium (Cr) are first formed on the insulator substrate 10. Subsequently, a gate insulating film 12 and an active layer 13 composed of p-Si film are sequentially formed.

In the active layer 13, channels 13c are formed in a position above the gate electrodes 11. Ion doping is performed using stopper insulating film 14 formed on the channels 13c as masks. Regions on both sides of the gate electrodes 11 are then covered with a resist, and further ion doping is conducted. As a result, low-concentration regions 13LD are disposed on both sides of the channels 13c. Furthermore, a source 13s and a drain 13d, which are high-concentration regions, are formed on the outer sides of the low-concentration regions 13LD, respectively. The described structure is the so-called LDD (Lightly Doped Drain) structure.

Subsequently, an interlayer insulating film 15 comprising a sequential lamination of a $Sio_2$ film, a SiN film, and a $SiO_2$ film is formed to cover the entire region over the gate insulating film 12, the active layer 13, and the stopper insulating film 14. A contact hole formed with respect to the drain 13d is filled with metal such as aluminum (Al) to provide the drain electrode 16. A planarizing insulating film 17 consisting of, for example, organic resin is formed over the entire surface, planarizing the surface. A contact hole is formed in the planarizing insulating film 17 at a location corresponding to the source 13s, and an anode 81 of an EL element is then formed over the planarizing insulating film 17 through the contact hole. The anode 81 is composed of ITO (Indium Tin Oxide), and simultaneously serves as the source electrode through its contact with the source 13s via the contact hole.

Subsequently, an EL element is formed on the anode 81.

In the organic EL element, holes injected from the anode 81 and electrons injected from the cathode 87 recombine in the emissive layer which is one layer within the emissive element layer 86 including organic compounds. As a result, organic molecules constituting the emissive layer are excited, generating excitons. Through the process in which these excitons undergo radiation until deactivation, light is emitted from the emissive layer. This light radiates outward through the side of the transparent anode 81 via the transparent insulator substrate 10, resulting in light emission.

When the EL element is formed as described above, the emissive element layer 86 deposited over the anode 81 is extremely thin, generally at a thickness of approximately less than 2000 Å. The emissive element layer 86 therefore provides poor coverage at uneven portions on the planarizing insulating film 17 at the peripheral portions of the anode 81 (indicated by arrows). The poor coverage may also result at irregularities in the surface created by the TFT through, for example, the thickness of the Al wiring. A problem exists where the emissive element layer 86 becomes disconnected, and the cathode 87 disposed over the emissive element layer and the anode 81 forms a short circuit at the disconnected portion. In such cases, pixels produce deficient displays.

Another existing problem is that an electric field becomes concentrated at the uneven portions created by the thickness of the anode 81, especially at the edges on the peripheral portions of the anode 81, thereby speeding up the deterioration of the emissive layer.

A further disadvantage is that some of the emitted light irradiates the TFT underneath the emissive element layer. Because of such light, leakage current of the TFT increases, and stable TFT characteristics and stable display cannot be achieved.

SUMMARY OF THE INVENTION

The present invention was created in light of the above existing disadvantages. The purpose of the present invention is to prevent formation of short circuits between the cathode and the anode due to disconnection in the emissive element caused by the thickness of the anode. Another purpose of the present invention is to provide an EL element and an EL display device which reduces deterioration of the emissive layer due to concentration of electric field at the edges of the anode and which achieves stable display by preventing light from the emissive element layer from reaching the TFT.

The emissive element or the display device of the present invention comprises an emissive region formed by laminating a first electrode, an emissive element layer, and a second electrode. An insulating film is disposed on at least a peripheral portion of the first electrode to separate the first electrode from the emissive element layer and/or the second electrode.

According to another aspect of the present invention, each pixel in the display device is provided with the emissive element. Moreover, the first electrode is separately formed for each pixel, and a peripheral portion of each of the separately formed first electrodes is covered by the insulating film.

In a further aspect of the present invention, the insulating film is disposed between the first electrode and the emissive element layer.

In a different aspect of the present invention, the insulating film overlaps the first electrode along the entire peripheral portion outlining the first electrode.

By providing such insulating film between the first electrode and the emissive element layer and/or the second electrode, it is possible to prevent problems occurring at the uneven portion created by the thickness of the first electrode, such as disconnection of the overlying emissive element layer or the second electrode, and formation of short circuit between the first and the second electrodes. Furthermore, the insulating layer covering the peripheral portion of the first electrode reduces concentration of electric field at this peripheral portion, and thereby reduces characteristics deterioration of the overlying emissive element layer. The effect of reduction in characteristics deterioration is enhanced especially when the entire peripheral portion outlining the first electrode is covered with the insulating film.

According to another aspect of the present invention, the insulating film in the emissive element or the display device covers a peripheral portion of the first electrode, and includes an opening over the associated first electrode. An edge portion of the opening forms a slope.

In the present invention, the edge portion of the opening slopes at, for example, an angle of elevation between 20° and 80° with respect to the horizontal plane of the first electrode.

In a different aspect of the present invention, the emissive element is an electroluminescence element.

This element emits light by controlling electric field. An element using an organic compound in its emissive element layer, namely, an organic EL element, may be employed as the emissive element of the present invention.

According to a further aspect of the present invention, the first electrode in the emissive element or the display device is connected to a thin-film transistor.

In a further different aspect, the first electrode of the emissive element is positioned as a layer above the thin-film transistor with an insulating layer placed between the thin-film transistor and the first electrode for providing interlayer isolation.

According to this arrangement having a thin-film transistor connected to the first electrode of the emissive element, light emission of the emissive element can be controlled by the thin-film transistor. When, for example, each pixel of a display device is provided with the emissive element and such a thin-film transistor, light emission of each pixel can be controlled individually, achieving a high-resolution display.

Another aspect of the present invention is that, in the above emissive element or the display device, the insulating film disposed on at least a peripheral portion of the first electrode and separating the first electrode from the emissive layer and/or the second electrode is a planarizing insulating film.

By separating the first electrode from the emissive layer and/or the second electrode with a planarizing insulating film, concentration of electric field at the peripheral portion of the first electrode can be prevented. At the same time, as levelness is enhanced on the upper surface of the planarizing insulating film, disconnection, formation of short circuits, and concentration of electric field due to irregularities in the surface can be prevented in regions other than the peripheral portion of the first electrode.

A different aspect of the present invention is that, in the emissive element or the display device, the insulating film covering at least a peripheral portion of the first electrode is colored.

The coloring in the present invention is, for example, black.

In a further aspect of the present invention, the insulating film covering at least a peripheral portion of the first electrode possesses a light-shielding property and/or a light-absorbing property.

Another different aspect of the present invention is that, in the emissive element or the display device, the insulating film covering at least a peripheral portion of the first electrode further covers a region where the thin-film transistor connecting with the first electrode is formed.

By coloring the insulating film covering a peripheral portion of the first electrode black, the contrast ratio with respect to the region not covered by the insulating film can be increased. Light-shielding and/or light-absorbing properties of the insulating film can prevent external light or reflected light from the second electrode from entering other adjacent pixels which can result in display blurs and, in the case of a color display, deterioration of color purity caused by mixing of colors from other pixels. Furthermore, light-shielding and/or light-absorbing properties of the insulating film allows prevention of harmful effects on the operation of the TFT driving the emissive element. That is, if light from the emissive element layer reaches the TFT, leakage current of the TFT is likely to increase. At the same time, light from the emissive element layer is also prevented from detouring into and irradiating adjacent display pixels after being reflected off the cathode. Accordingly, an EL display device with an enhanced display quality can be provided.

DESCRIPTION OF PREFERRED EMBODIMENTS

The display device of the present invention will now be described as embodied in an organic EL display device.

<First Embodiment>

Figure 3:
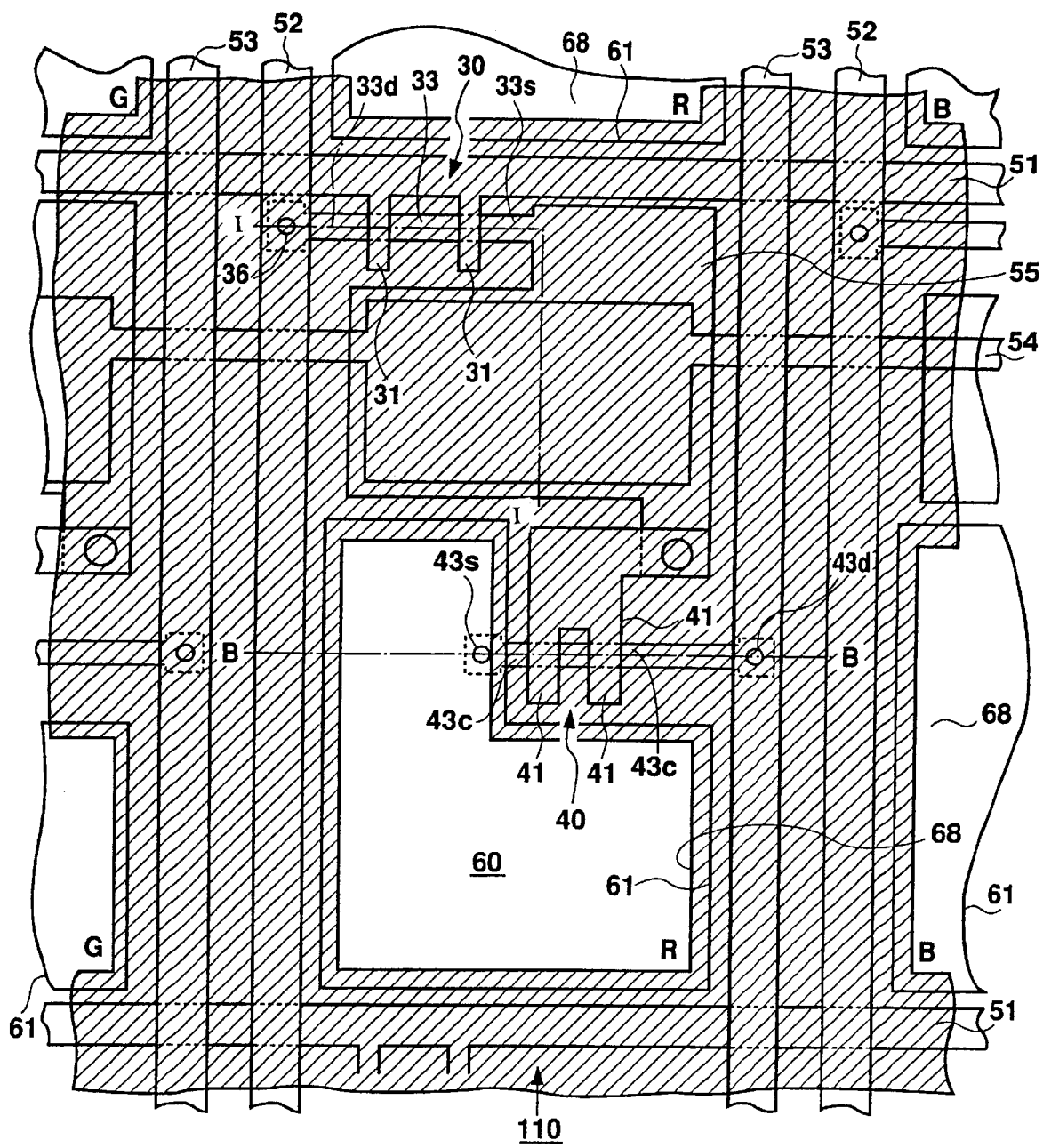
FIG. 3 shows a plan view of an EL display device according to a first embodiment of the present invention.
Figure 4A:
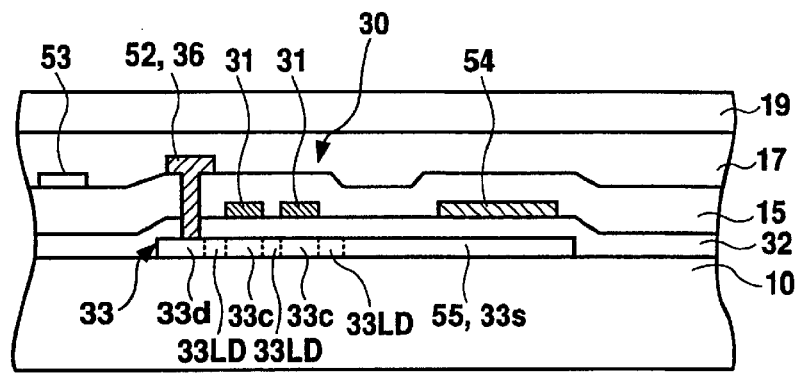
FIGS. 4A and 4B show cross-sectional views of the EL display device according to the first embodiment of the present invention.

FIG. 3 shows a plan view around a display pixel of an organic EL display device. FIG. 4A shows a cross-sectional view taken along line I—I in FIG. 3, and FIG. 4B illustrates a cross-sectional view taken along line II—II in FIG. 3.

Figure 4B:
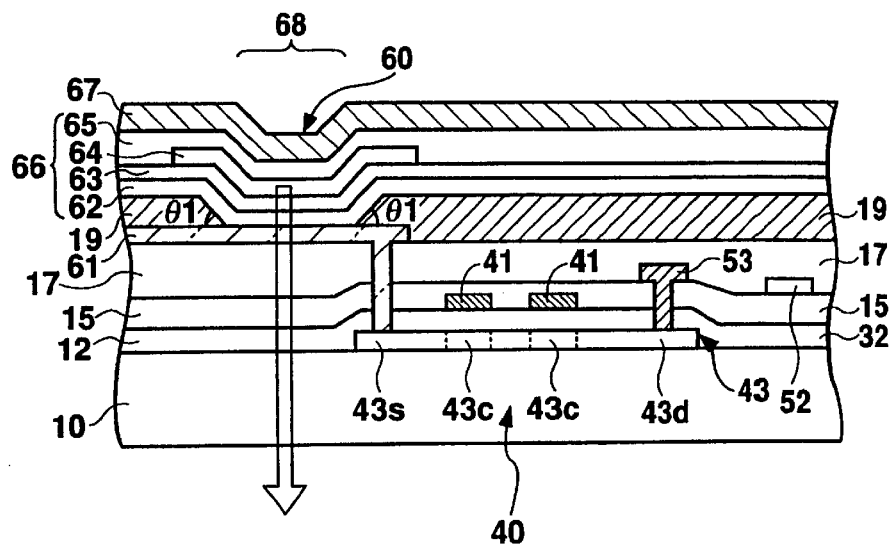

As shown in FIGS. 3, 4A, and 4B, a display pixel 110 is formed in a region surrounded by gate signal lines 51 and drain signal lines 52. The pixels 110 are arranged in a matrix.

The display pixel 110 includes an organic EL element 60 which is a self-luminous element, a switching TFT 30 for controlling the timing for supplying current to the organic EL element 60, a driving TFT 40 for supplying current to the organic EL element 60, and a storage capacitor. The organic EL element 60 comprises an anode 61 which is the first electrode, an emissive element layer 66 including emissive material, and a cathode 67 which is the second electrode.

The first TFT 30 (for switching) is disposed near a junction of the two signal lines 51, 52. The source 33s of the TFT 30 serves as the capacitive electrode 55 that provides capacitance in conjunction with a storage capacitor electrode line 54. The source 33s is connected to the gate 41 of the second TFT 40 (for driving the EL element). The source 43s of the second TFT is connected to the anode 61 of the organic EL element 60. The drain 43d, on the other hand, is connected to the drive power line 53 which supplies power to the organic EL element 60.

The storage capacitor electrode line 54 is arranged in parallel with the gate signal line 51. The storage capacitor electrode line 54 may be made of chromium, and capacitance is formed by storing electric charge between the capacitive electrodes 55 connected to the source 33s of the TFT via the gate insulating film 12. The storage capacitor is provided for retaining the voltage applied on the gate electrode 41 of the second TFT 40.

As shown in FIGS. 4A and 4B, the organic EL display device is formed by sequentially laminating TFT and the organic EL element on a substrate 10 which may be an insulator substrate made of glass or synthetic resin, a conductive substrate, or a semiconductor substrate. When a conductive substrate or a semiconductor substrate is used as the substrate 10, an insulating film made of materials such as $SiO_2$ or SiN is deposited on the substrate 10 before forming the first and the second TFT and the organic EL element. Both of the TFTs have the so-called top gate structure wherein the gate electrodes are arranged over the active layers with the gate insulating film disposed in between.

The first TFT 30 for switching will now be described.

As shown in FIG. 4A, amorphous silicon film (referred to hereinafter as "a-Si film") is grown by CVD or a similar method on an insulator substrate 10 which may be made of quartz glass or non-alkali glass. The a-Si film is irradiated with a laser beam for melting and recrystallization into a polycrystalline silicon film (referred to hereinafter as "p-Si film"). This film serves as the active layer 33. Over this layer, a single layer of $SiO_2$ film or SiN film, or a lamination of those films, is formed to create the gate insulating film 32. Disposed further on top are the gate signal lines 51 also serving as the gate electrodes 31 which are made of refractory metal such as Cr and Mo, and the drain signal lines 52 composed of Al. Also arranged are the drive power lines 53 composed of Al for supplying drive power to the organic EL element.

In the active layer 33, channels 33c are positioned below the gate electrodes 31. Ion doping is performed using the gate electrodes 31 formed above the channels 33c as masks. Regions on both sides of the gate electrodes 31 are then covered with a resist, and further ion doping is conducted. As a result, low-concentration regions 33LD are disposed on both sides of the channels 33c. Furthermore, a source 33s and a drain 33d, which are high-concentration regions, are formed on the outer sides of the low-concentration regions 33LD, respectively. The described structure is the so-called LDD structure.

Subsequently, an interlayer insulating film 15 comprising a sequential lamination of a $SiO_2$ film, a SiN film, and a $SiO_2$ film is formed to cover the entire region over the gate insulating film 32 and the active layer 33. A contact hole formed with respect to the drain 33d is filled with metal such as Al to provide the drain electrode 36. Furthermore, a planarizing insulating film 17 consisting of organic resin is formed over the entire surface, planarizing the surface.

The second TFT 40 for driving the organic EL element will next be described.

As shown in FIG. 4B, an active layer 43 is formed using p-Si film obtained by irradiating a-Si film with a laser beam and allowing it to polycrystallize on an insulator substrate 10 which may be made of quartz glass or non-alkali glass. Sequentially formed over this layer are a gate insulating film 32 and a gate electrode 41 composed of a refractory metal such as Cr and Mo. In the active layer 43, channels 43c are provided, and a source 43s and a drain 43d are formed on both sides of the channels 43c, respectively. An interlayer insulating film 15 comprising a sequential lamination of a $SiO_2$ film, a SiN film, and a $SiO_2$ film is formed to cover the entire region over the gate insulating film 32 and the active layer 43. A contact hole formed with respect to the drain 43d is filled with metal such as Al to provide a drive power line 53 connected with a drive power supply. In addition, a planarizing insulating film 17 consisting of, for example, organic resin is formed over the entire surface, planarizing the surface. A contact hole is formed in the planarizing insulating film 17 at a location corresponding to the source 43s, and a transparent electrode composed of ITO and contacting the source 43s via the contact hole, namely, the anode 61 of the EL element, is formed over the planarizing insulating film 17. The anode 61 is separately formed for each display pixel in the form of discrete islands.

As shown by slanted lines in FIG. 4B, an insulating film 19 is disposed so that its edge portions lie on the peripheral portion of the anode 61. The insulating film 19 overlaps the anode 61 along the entire periphery of the anode 61. In other words, an insulating film 19 having an opening in a region corresponding to a portion of the anode 61 is formed over the anode and the planarizing insulating film 17. Accordingly, at the peripheral portion of the anode 61, the insulating film 19 separates the peripheral portion of the anode 61 from the emissive element layer 66 and the cathode 67. The insulating film 19 is formed such that the emissive layer does not become disconnected due to an uneven surface created by the thickness of the anode 61 at its peripheral portion, and such that concentration of electric field does not occur at the peripheral edges of the anode 61. It is sufficient if the insulating film 19 separates the peripheral portion of the anode 61 from one of either the emissive element layer 66 or the cathode. The insulating film 19 may be composed of a single layer of $SiO_2$ film or SiN film, or a lamination of those films. The insulating film 19 may also be a planarizing film composed of SOG film, or a planarizing insulating film made of photosensitive resin. It is preferable to employ a planarizing insulating film as the insulating film 19 because the cathode 67 can then be formed flatly in an overlying layer, preventing disconnection.

The insulating film 19 has an opening over the anode 61, and the edge portion of the opening forms a slope with respect to the surface of the anode 61. It is preferable that the angle of elevation of the slope is of such a degree that the emissive element layer 66 formed over the anode 61 does not become disconnected near the edges of the opening of the insulating film 19. When the angle of elevation is too small, the area of the anode 61 covered by the insulating film 19 is enlarged, leaving only a small area for light emission. When the angle of elevation is too large, the emissive element layer 66 may become disconnected. The angle of elevation ($\theta 1$) is therefore set between 20° and 80°. The angle of elevation θ1 is preferably between 30° and 70°, more preferably between 30° and 60°, and most preferably between 40° and 50°.

The emissive element layer 66 and the, cathode 67 are overlaid on the insulating film 19 and the anode 61 exposed from the opening in the insulating film 19.

It is to be noted that the insulating film 19 is not transparent but colored. The coloring is possible by, for example, applying resin such as a color resist. The color used for the coloring may be any color that can shield the emitted light, but is preferably black. Using black allows absorption of light travelling to the metal cathode 67 and reflecting off the cathode 67. Accordingly, even in the case of an extremely fine EL display device in which adjacent display pixels are located very close together, light from an emissive element layer of other adjacent display pixels can be prevented from being reflected of f the cathode of a surrounded pixel and detouring into the pixel.

The coloring of the insulating film may also be implemented by mixing, for example, black pigment into a resist comprising a viscous resin, and applying the resist.

Figure 1:
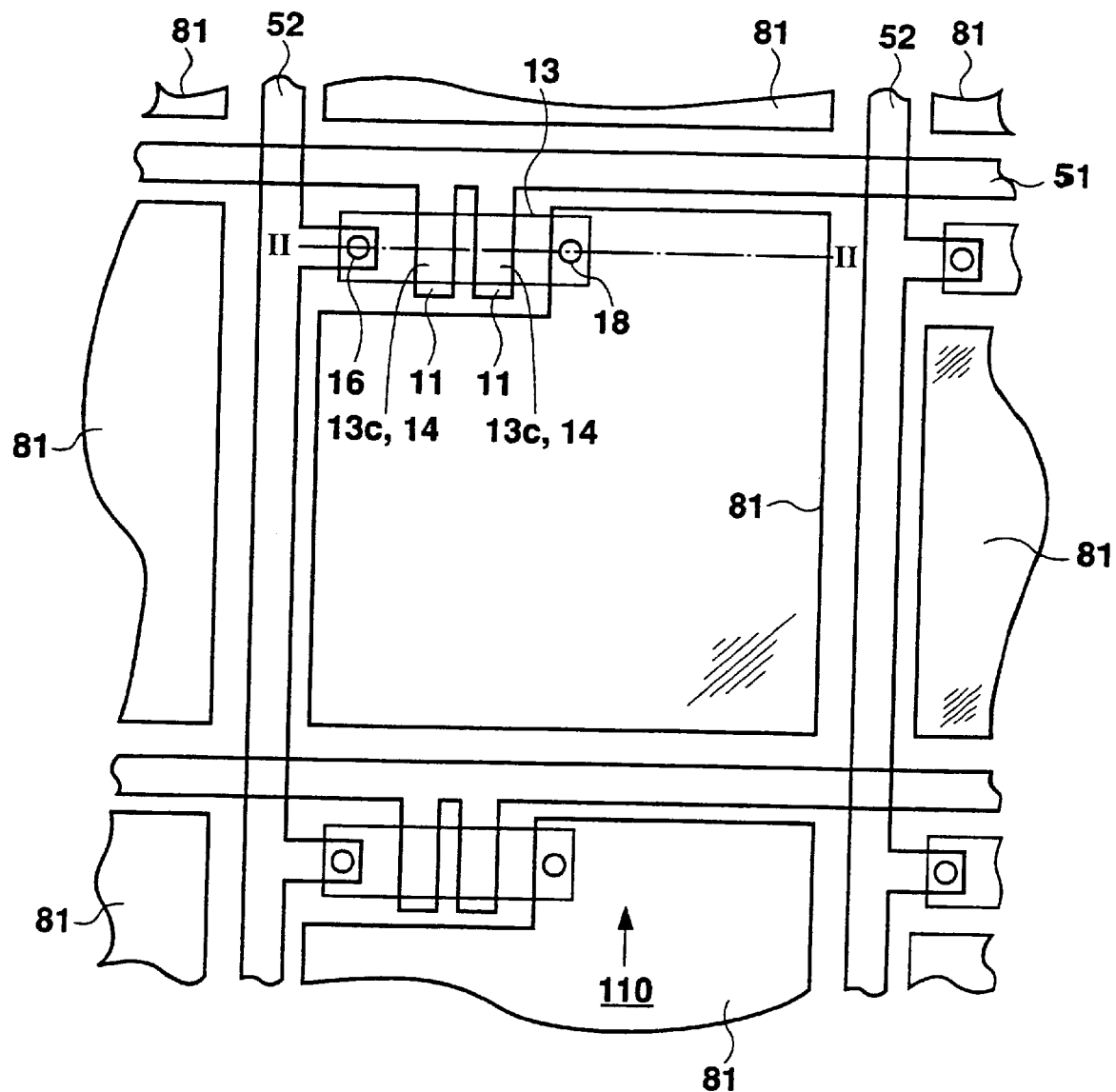
FIG. 1 is a plan view illustrating an example of a related art of active type EL display device.
Figure 2:
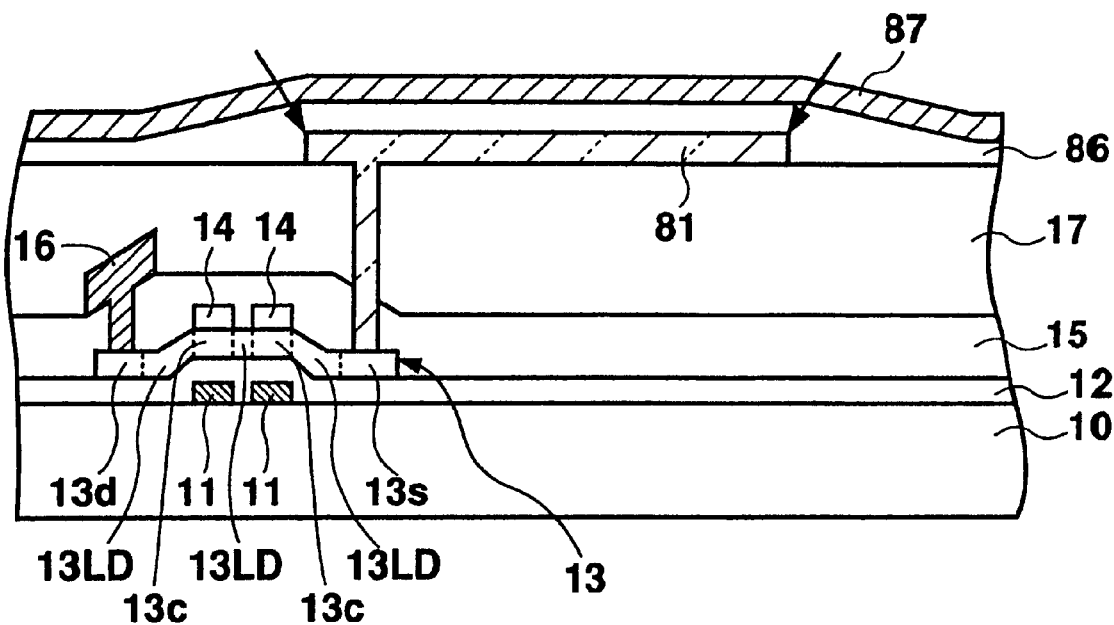
FIG. 2 shows a cross-sectional view of the EL display device of FIG. 1 taken along line II—II.

According to the above-described structure, the opening 68 which serves as the contact hole in the insulating film 19 corresponds to the white portion without slanted lines in FIG. 1. The insulating film 19 overlaps the anode 61 at the peripheral portion of the anode 61.

The organic EL element 60 is formed by first laminating the anode 61 constituted by a transparent electrode made of ITO or similar material. The emissive element layer 66 is then superimposed. The emissive element layer 66 comprises a first hole-transport layer 62 composed of a material such as MTDATA, a second hole-transport layer 63 composed of a material such as TPD, an emissive layer 64 in the form of discrete islands composed of, for example, $Bebq_2$ including quinacridone derivatives, and an electron transport layer 65 composed of $Bebq_2$ or similar material. Subsequently, the cathode 67 is formed which may be composed of a lamination of lithium fluoride (LiF) and Al, an alloy of Al and Li, an alloy of magnesium (Mg) and silver (Ag), or an alloy of Mg and In. All of the above-mentioned layers of the organic EL element 60 are laminated in the described order. The region where all these layers overlap is the emissive region. By selecting materials that emit light of particular colors as the emissive material used in the emissive element layer 66, especially in the emissive layer 64, display pixels can be made to emit light of the respective colors. The organic EL display device is formed by arranging those display pixels of the respective colors in a matrix.

Figure 5:
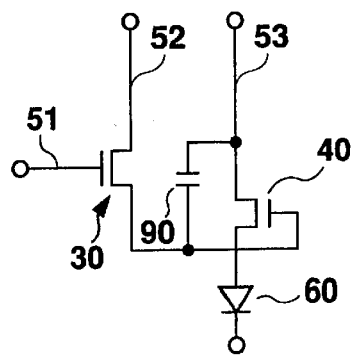
FIG. 5 is a diagram illustrating an example circuit configuration in each pixel of the EL display device of the present invention.

An example of the electrical configuration of each of the pixels in the organic EL display device is shown in FIG. 5. Referring to FIG. 5, the switching TFT 30 is turned on when a gate signal is applied on the gate electrode 31 via the gate signal line 51. As a result, a drive signal from the drive signal line 52 is retained in a capacitor 90. The retained voltage is then supplied to the gate electrode 41 of the driving TFT 40. The drain electrode of the TFT 40 is connected to the drive power line 53, as described above. The TFT 40 allows current to be supplied from the drive power supply to the EL element 60 by an amount corresponding to the capacitor-held voltage applied to the gate electrode 41. The EL element 60 emits light accordingly.

Providing the insulating film 19 at the peripheral portion of the anode 61 as described prevents disconnection of the emissive element layer 66 due to uneven portions created by the thickness of the anode 61, and therefore prevents formation of a short circuit between the anode 61 and the cathode 67. Furthermore, the insulating layer 19 reduces concentration of electric field at the edges of the anode 61, thereby suppressing deterioration of the emissive element layer 66.

In addition, by providing the colored insulating film 19 over a region including the peripheral portion of the transparent anode and the areas over the TFT, light emitted from the emissive element layer 66 is prevented from reaching the TFT underlying the emissive element layer 66. Increase in leakage current of the TFT can thereby be avoided.

<Second Embodiment>

Figure 6:
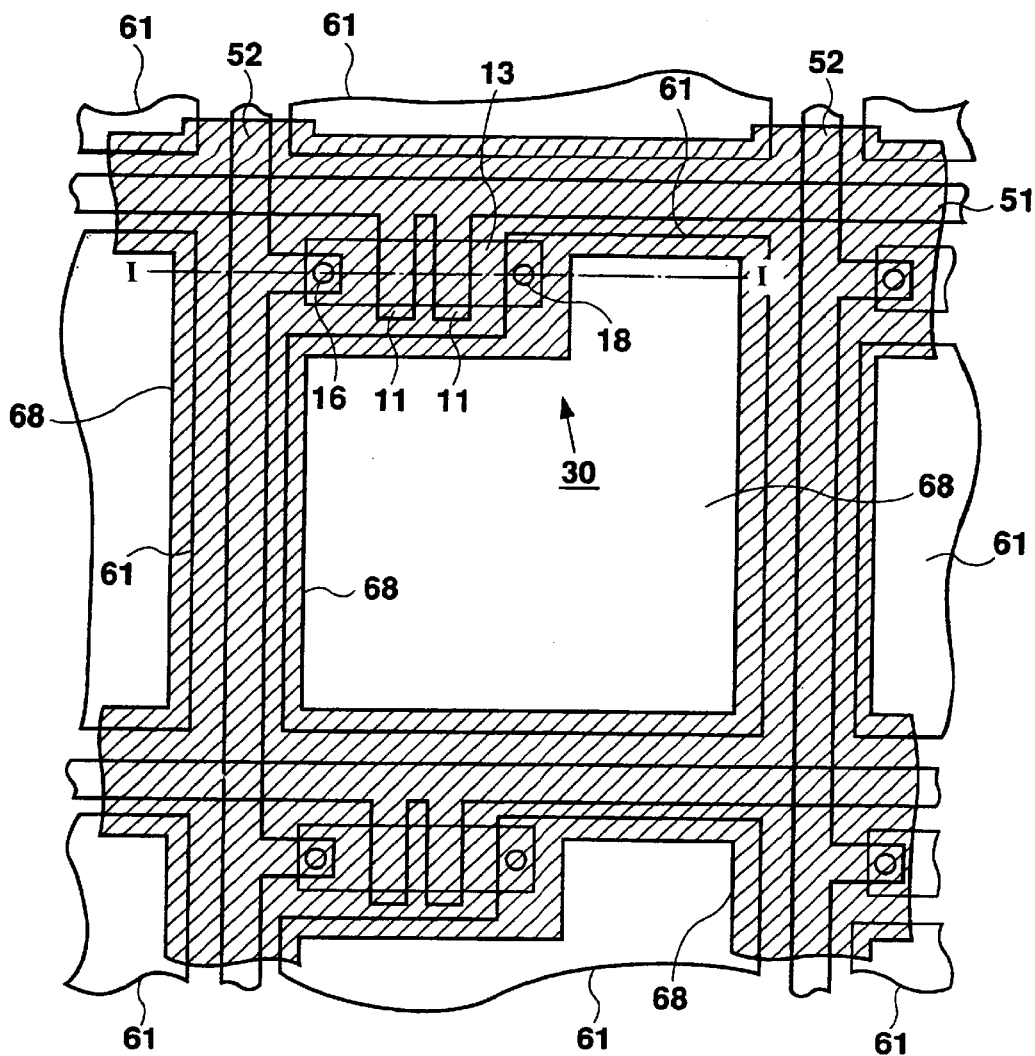
FIG. 6 shows a plan view of an EL display device according to a second embodiment of the present invention.
Figure 7:
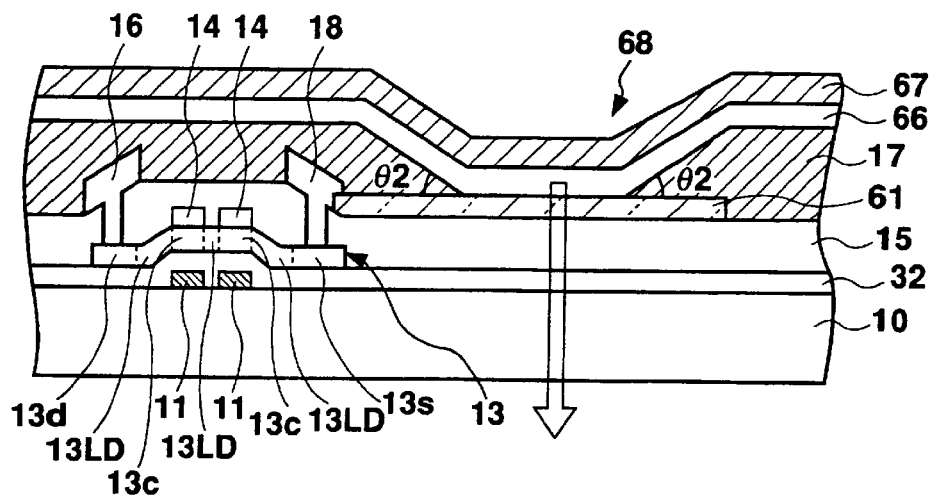
FIG. 7 shows a cross-sectional view of the EL display device according to the second embodiment of the present invention.

FIG. 6 is a plan view of one display pixel of an organic EL display device including an organic EL element and TFT according to an embodiment of the present invention. FIG. 7 shows a cross-sectional view taken along line I—I in FIG. 6.

The present embodiment differs from the first embodiment in that only one TFT is provided for driving the EL element 60, and that the anode 61 is formed over the interlayer insulating film 15.

As shown in FIGS. 6 and 7, TFT 30 is disposed near a junction of a gate signal line 51 and a drain signal line 52. The source 13s of the TFT 30 is connected to the anode 61 of the organic EL element 60.

As shown in FIG. 7, the display pixel 110 is formed by sequentially laminating TFT and an organic EL element on a substrate 10 which may be an insulator substrate made of glass or synthetic resin, a conductive substrate, or a semiconductor substrate. When a conductive substrate or a semiconductor substrate is used as the substrate 10, an insulating film 32 made of materials such as $SiO_2$ or SiN is deposited on the substrate 10 before forming the TFT.

As shown in FIG. 7, gate electrodes 11 composed of refractory metal such as Cr or Mo and a gate signal line 51 connected to the gate electrodes 11 are formed on the insulator substrate 10 which may be made of quartz glass or non-alkali glass.

Subsequently, a gate insulating film 12 and an active layer 13 made of p-Si film are sequentially formed.

In the active layer 13, channels 13c are formed in a position above the gate electrodes 11. Ion doping is performed using stopper insulating film 14 formed on the channels 13c as masks. Regions on both sides of the gate electrodes 11 are then covered with a resist, and further ion doping is conducted. As a result, low-concentration regions 13LD are disposed on both sides of the channels 13c. Furthermore, a source 13s and a drain 13d, which are high-concentration regions, are formed on the outer sides of the low-concentration regions 13LD, respectively. The described structure is the so-called LDD structure.

Subsequently, an interlayer insulating film 15 comprising a sequential lamination of a $SiO_2$ film, a SiN film, and a $SiO_2$ film is formed to cover the entire region over the gate insulating film 12, the active layer 13, and the stopper insulating film 14.

On top of the interlayer insulating film 15, an anode 61 is formed which is a transparent electrode composed of a transparent conductive material such as ITO. Subsequently, contact holes formed with respect to the drain 13d and the source 13s are filled with metal such as Al to provide the drain electrode 16 and the source electrode 18. It is to be noted that the source electrode 18 is made to contact the transparent anode 61.

A planarizing insulating film 17 composed of resin is then formed over the entire region covering the anode 61, the source electrode 18, the drain electrode 16, and the interlayer insulating film 15, thereby planarizing the surface. An opening is formed in the planarizing insulating film 17 at a location corresponding to the anode 61. As shown by slanted lines in FIG. 6, the opening is aligned such that the planarizing insulating film 17 covers at least the peripheral portion of the anode 61.

It is to be noted that the planarizing insulating film 17 is not transparent but colored. The coloring is made possible by, for example, applying resin such as a color resist. The color used for the coloring may be any color that can shield the emitted light, but is preferably black. Using black allows absorption of light that travels to the metal cathode 67 and reflects off the cathode 67. Accordingly, even in a case of an extremely fine EL display device where adjacent display pixels are located very close together, light from an emissive element layer of adjacent display pixels can be prevented from being reflected off the cathode of a surrounded pixel and detouring into the pixel.

The coloring on the insulating film may also be implemented by mixing, for example, black pigment into a resist comprising a viscous resin, and applying the resist.

By providing such colored planarizing insulating film 17 over a region including the peripheral portions of the transparent anode and the area over the TFT, light emitted from the emissive element layer 66 is prevented from reaching the TFT underneath the emissive element layer 66. Increase in leakage current of the TFT due to light from the EL element 60 can thereby be avoided.

Further, at the peripheral portion of the anode 61, the side wall of the opening in the planarizing insulating film 17 forms a slope with respect to the surface of the anode 61, generating an angle of elevation θ2 with respect to the anode 61.

It is preferable that the angle of elevation is at a degree such that the emissive element layer 66 formed over the anode 61 does not become disconnected due to the an uneven surface at the opening 68. When the angle of elevation is too small, the area of the anode 61 covered by the planarizing insulating film 17 is enlarged, leaving only a small emissive area. When the angle of elevation is too large, the emissive element layer 66 may become disconnected at the uneven surface at the opening 68. The angle of elevation (θ2) is therefore set between 20° to 80°. The angle of elevation θ2 is preferably between 30° and 70°, more preferably between 30° and 60°, and further preferably between 40° and 50°.

When the insulating film 17 is made of photosensitive resin, the slope of the insulating film 17 can be formed by performing annealing after exposing and developing predetermined areas using a mask. When the insulating film 17 is a SOG film, the slope can be formed by performing dry etching on the film 17 using a chlorine class etchant gas.

The structure of the organic EL element 60 is similar to the above-described first embodiment. Provided between the anode 61 and the cathode 67 in the region covering the opening 68 of the insulating film 17 is the emissive element layer 66 which comprises, for example, a first hole-transport layer composed of MTDATA, a second hole-transport layer made of TPD, an emissive layer made of Bebq$_2$ including quinacridone derivatives, and an electron transport layer formed of Bebq$_2$. The emissive element layer 66 connects to the anode 61 through the contact hole (opening) formed in the planarizing insulating film 17.

In the organic EL element, holes injected from the anode and electrons injected from the cathode recombine within the emissive layer. As a result, organic molecules constituting the emissive layer are excited, generating excitons. Through the process in which these excitons undergo radiation until deactivation, light is emitted from the emissive layer. This light radiates outward through the transparent anode and the transparent insulator substrate, resulting in light emission. In the present embodiment, the emitted light of the EL element shines downwardly.

Providing the planarizing insulating film 17 at the peripheral portion of the anode 61 as described prevents disconnection of the emissive element layer 66 due to uneven portions created by the thickness of the anode 61, and therefore prevents formation of a short circuit between the anode 61 and the cathode 67. Furthermore, the planarizing insulating layer 17 reduces concentration of electric field at the edges of the anode 61, thereby suppressing deterioration of the emissive element layer 66. Moreover, by providing the colored insulating film 19 over a region including at least the peripheral portion of the transparent anode and the area over the TFT, light emitted from the emissive element layer 66 is prevented from reaching the TFT underneath the emissive element layer 66. Increase in leakage current of the TFT can thereby be avoided.

<Third Embodiment>

Figure 8:
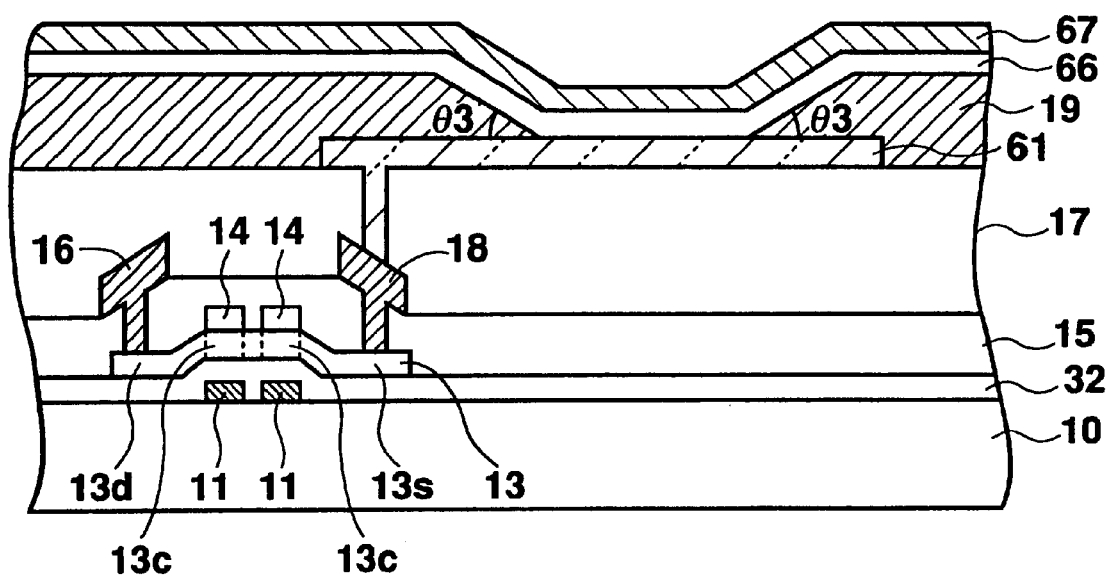
FIG. 8 shows a cross-sectional view of the EL display device according to a third embodiment of the present invention.

FIG. 8 is a cross-sectional view of an organic EL display device according to a third embodiment of the present invention. The plan configuration of this embodiment is identical with the above-described FIG. 6, and FIG. 8 shows a cross-sectional view taken along line I—I in FIG. 6.

As shown in FIG. 8, the present embodiment differs from the second embodiment mainly in the structure between the source region 13s of TFT 30 and the anode 61 of the EL element. In the present embodiment, the contact holes formed in the interlayer insulating film 15 are filled with metal such as Al to provide the drain electrode 16 and the source electrode 18. The planarizing insulating film 17 is then deposited to planarize the surface. A contact hole is formed in the planarizing insulating film 17 at a location corresponding to the source electrode. Through this contact hole, the transparent electrode 61 is formed which is composed of a transparent conductive material such as ITO. Subsequently, the insulating film 19 is disposed over an extended area so as to overlap the peripheral portions of the transparent electrode. To summarize, the anode 61 is formed over the planarizing insulating film 17, and the insulating film 19 is formed covering the peripheral portion of the anode 61. In other words, the present embodiment differs from the second embodiment in that the transparent electrode 61 is disposed in a different layer above the drain electrode 16 and the source electrode 18 separated by the planarizing insulating film 17.

At the peripheral portion of the anode 61, the insulating film 19 forms a slope with respect to the surface of the anode 61. It is preferable that this angle of elevation is of such a degree that the emissive element layer 66 formed over the anode 61 does not become disconnected. When the angle of elevation is too small, the area of the anode 61 covered by the insulating film 19 is enlarged, leaving only a small area for light emission. When the angle of elevation is too large, the emissive element layer 66 may become disconnected. The angle of elevation (θ3) is therefore set between 20° to 80°. The angle of elevation θ3 is preferably between 30° and 70°, more preferably between 30° and 60°, and most preferably between 40° and 50°. When the angle of elevation is too small, the area of the anode 61 covered by the insulating film 19 is enlarged, while, when the angle of elevation is too large, the emissive element layer 66 may become disconnected.

It is to be noted that the insulating film 19 is not transparent but colored. The coloring is possible by, for example, applying resin such as a color resist. The color used for the coloring may be any color that can shield the emitted light, but is preferably black. Using black allows absorption of light that travels to the metal cathode 67 and reflects off the cathode 67. Accordingly, even in a case of an extremely fine EL display device wherein adjacent display pixels are located very close together, light from emissive element layer of adjacent display pixels can be prevented from being reflected off the cathode of a surrounded pixel and detouring into the pixel.

The coloring on the insulating film may also be implemented by mixing, for example, black pigment into a resist comprising a viscous resin, and applying the resist.

The opening 68 which serves as the contact hole in the insulating film 19 corresponds to the white portion without slanted lines in FIG. 6. The insulating film 19 overlaps the anode 61 at the peripheral portion of the anode 61.

The insulating film 19 may be composed of a single layer of $SiO_2$ film or SiN film, or a lamination of those films. The insulating film 19 may also be a planarizing film composed of SOG film, or a planarizing insulating film made of photosensitive resin. It is preferable to employ a planarizing insulating film as the insulating film 19 because the cathode 67 can then be formed flatly in an overlying layer, preventing disconnection.

As in the above-described embodiments, the present embodiment also prevents disconnection of the emissive element layer 66 due to uneven portions created by the thickness of the anode 61, and therefore prevents formation of a short circuit between the anode 61 and the cathode 67. Further, according to the present embodiment, as the surface of the layer over the TFT is planarized, it is possible to form the transparent electrode 61 over the TFT. Moreover, the present embodiment reduces concentration of electric field at the edges of the anode 61, thereby suppressing deterioration of the emissive element layer 66. In addition, by providing the colored insulating film 19 over a region including at least the peripheral portion of the transparent anode and the areas over the TFT, light emitted from the emissive element layer 66 is prevented from reaching the TFT underlying the emissive element layer 66. Increase in leakage current of the TFT can thereby be avoided.

In the above embodiments, the TFTs were described as having either the so-called bottom gate structure with the gate electrodes disposed under the active layer or the top gate structure. It is noted that identical effects can be achieved in the present invention using either of these structures. Although p-Si film was used as the active layer in the above description, small grain size crystalline silicon film or amorphous silicon may also be used.

In the above embodiments, the insulating film 19 and the planarizing insulating film 17 were illustrated as being colored. However, regarding prevention of disconnection of the emissive element layer due to the thickness of the anode to avoid formation of a short circuit between the anode 61 and the cathode 67, and reduction of concentration of electric field at the edges of the anode to suppress deterioration of the emissive element layer, those effects can be similarly achieved even when the insulating film 19 and the planarizing insulating film 17 are transparent.

What is claimed is:

1. An emissive element comprising a first electrode, an emissive element layer, a second electrode, and an insulating film wherein:
said insulating film is disposed on at least a peripheral portion of said first electrode for separating said first electrode from said emissive element layer and/or said second electrode, and said insulating film has a planarized surface.

2. The emissive element defined in claim 1, wherein:
said insulating film is formed between said first electrode and said emissive element layer.

3. The emissive element defined in claim 1, wherein:
said insulating film covers the peripheral portion of said first electrode, and includes an opening over said first electrode, said opening having an edge portion forming a slope.

4. The emissive element defined in claim 3, wherein:
said edge portion of said opening slopes at an angle of elevation between 20° and 80° with respect to a horizontal plane of said first electrode.

5. The emissive element defined in claim 1, wherein:
said insulating film overlaps said first electrode along entire peripheral portion outlining said first electrode.

6. The emissive element defined in claim 1, wherein:
said emissive element is an electroluminescence element.

7. The emissive element defined in claim 1, wherein:
said first electrode is connected to a thin-film transistor.

8. The emissive element defined in claim 1, wherein:
said insulating film is colored.

9. The emissive element defined in claim 8, wherein:
said insulating film is colored black.

10. The emissive element defined in claim 1, wherein:
said insulating film possesses a light-shielding property and/or a light-absorbing property.

11. An emissive element, comprising a first electrode, an emissive element layer, and a second electrode, wherein:
an insulating film is disposed on at least a peripheral portion of said first electrode for separating said first electrode from said emissive element layer and/or said second electrode; and
said first electrode is connected to a thin-film transistor, and said first electrode is located in a layer over said thin-film transistor with an insulating film for interlayer isolation disposed between said first electrode and said thin-film transistor.

12. An emissive element, comprising a first electrode, an emissive element layer, and a second electrode, wherein:
an insulating film is disposed on at least a peripheral portion of said first electrode for separating said first electrode from said emissive element layer and/or said second electrode wherein:
said film possess a light-shielding property and/or a light-absorbing property; and
a thin-film transistor is connected to said first electrode and disposed in a layer below said first electrode; and
in addition to covering a peripheral portion of said first electrode, said insulating film covers a region where said thin-film transistor is formed.

13. A display device, comprising
an emissive element comprising a first electrode, an emissive element layer, a second electrode, and an insulating film, wherein:
said insulating film is disposed on at least a peripheral portion of said first electrode for separating said first electrode from said emissive element layer and/or said second electrode, and said insulating film has a planarized surface.

14. The display device defined in claim 13, wherein:
said insulating film possesses a light-shielding property and/or a light-absorbing property.

15. The display device defined in claim 13, wherein:
said insulating film covers the peripheral portion of said first electrode, and includes an opening over said first electrode, said opening having an edge portion forming a slope.

16. The display device defined in claim 15, wherein:
said edge portion of said opening slopes at an angle of elevation between 20° and 80° with respect to a horizontal plane of said first electrode.

17. The display device defined in claim 13, wherein:
said emissive element is an electroluminescence element.

18. The display device defined in claim 13, wherein:
said first electrode is connected to a thin-film transistor.

19. The display device defined in claim 13, wherein:
said insulating film is a planarizing insulating film, and covers a peripheral portion of said first electrode.

20. The display device defined in claim 13, wherein:
said insulating film is colored.

21. The display device defined in claim 20, wherein:
said insulating film is colored black.

22. A display device, comprising an emissive element including a first electrode, an emissive element layer, and a second electrode, wherein:
an insulating film is disposed on at least a peripheral portion of said first electrode for separating said first electrode from said emissive element layer and/or said second electrode; and
said first electrode is connected to a thin-film transistor; and
said first electrode is located in a layer over said thin-film transistor with an insulating film for interlayer isolation disposed between said first electrode and said thin-film transistor.

23. A display device, comprising an emissive element including a first electrode, an emissive element layer, and a second electrode, wherein:
an insulating film is disposed on at least a peripheral portion of said first electrode for separating said first electrode form said emissive element layer and/or said second electrode; and
said insulating film possesses a light-shielding property and/or a light-absorbing property; and
a thin-film transistor is connected to said first electrode and disposed in a layer below said first electrode; and
in addition to covering a peripheral portion of said first electrode, said insulating film disposed between said first electrode and said emissive element layer covers a region where said thin-film transistor is formed.

24. An emissive element comprising a first electrode, an emissive element layer, a second electrode, an insulating film, and a planarizing insulating film, wherein:
said insulating film is disposed on at least a peripheral portion of said first electrode for separating said first electrode from said emissive element layer and/or said second electrode; and
said planarizing insulating film is disposed under said first electrode for planarizing an upper surface thereof.

25. The emissive element defined in claim 24, wherein:
said insulating film is a planarized surface.

26. The emissive element defined in claim 24, wherein:
said insulating film is formed between said first electrode and said emissive element layer.

27. The emissive element defined in claim 24, wherein:
said insulating film covers the peripheral portion of said first electrode, and includes an opening over said first electrode, said opening having an edge portion forming a slope.

28. The emissive element defined in claim 24, wherein:
said edge portion of said opening slopes at an angle of elevation between 20° and 80° with respect to a horizontal plane of said first electrode.

29. The emissive element defined in claim 24, wherein:
said insulating film overlaps said first electrode along entire peripheral portion outlining said first electrode.

30. The emissive element defined in claim 24, wherein:
said emissive element is an electroluminescence element.

31. The emissive element defined in claim 24, wherein:
said first electrode is connected to a thin-film transistor.

32. The emissive element defined in claim 31, wherein:
said first electrode is located in a layer over said thin-film transistor with an insulating film for interlayer isolation disposed between said first electrode and said thin-film transistor.

33. The emissive element defined in claim 24, wherein:
said insulating film is colored.

34. The emissive element defined in claim 33, wherein:
said insulating film is colored black.

35. The emissive element defined in claim 24, wherein:
said insulating film possesses a light-shielding property and/or a light-absorbing property.

36. The emissive element defmed in claim 35, further comprising:
a thin-film transistor connected to said first electrode and disposed in a layer below said first electrode, wherein, in addition to covering a peripheral portion of said first electrode, said insulating film covers a region where said thin-film transistor is formed.

37. A display device comprising:
an emissive element including a first electrode, an emissive element layer, a second electrode, an insulating film, and a planarizing insulating film, wherein:
said insulating film is disposed on at least a peripheral portion of said first electrode for separating said first electrode from said emissive element layer and/or said second electrode; and
said planarizing insulating film is disposed under said first electrode.

38. The display device defined in claim 37, wherein:
said insulating film has a planarized surface.

39. The display device defined in claim 37, wherein:
said insulating film is formed between said first electrode and said emissive element layer.

40. The display device defined in claim 37, wherein:
said insulating film covers the peripheral portion of said first electrode, and includes an opening over said first electrode, said opening having an edge portion forming a slope.

41. The display device defined in claim 37, wherein:
said edge portion of said opening slopes at an angle of elevation between 20° and 80° with respect to a horizontal plane of said first electrode.

42. The display device defined in claim 37, wherein:
said insulating film overlaps said first electrode along entire peripheral portion outlining said first electrode.

43. The display device defined in claim 37, wherein:
said emissive element is an electroluminescence element.

44. The display device defined in claim 37, wherein:
said first electrode is connected to a thin-film transistor.

45. The display device defined in claim 44, wherein:
said first electrode is located in a layer over said thin-film transistor with an insulating film for interlayer isolation disposed between said first electrode and said thin-film transistor.

46. The display device defined in claim 37, wherein:
said insulating film is colored.

47. The display device defined in claim 46, wherein:
said insulating film is colored black.

48. The display device defined in claim, 37, wherein:
said insulating film possesses a light-shielding property and/or a light-absorbing property.

49. The display device defined in claim 48, further comprising:

a thin-film transistor connected to said first electrode and disposed in a layer below said first electrode, wherein in addition to covering a peripheral portion of said first electrode, said insulating film covers a region where said thin-film transistor is formed.

* * * * *

UNITED STATES PATENT AND TRADEMARK OFFICE
CERTIFICATE OF CORRECTION

PATENT NO.    : 6,246,179 B1  
DATED         : June 12, 2001  
INVENTOR(S)   : Tsutomu Yamada Page 1 of 1

It is certified that error appears in the above-identified patent and that said Letters Patent is hereby corrected as shown below:

<u>Title page,</u>
Item [30], Foreign Application Priority Data delete "Dec. 2, 1998" and insert therefor -- Dec. 1, 1998 --

<u>Column 2,</u>
Line 1, after "element", insert -- 80 --
Line 2, after "element", insert -- 80 --
Line 12, after "element", insert -- 80 --

<u>Column 7,</u>
Line 4, after "and", delete "the," and insert therefor -- the --
Line 17, after "reflected", delete "of f" and insert therefor -- off --

<u>Column 14,</u>
Line 20, after "element", delete "defmed" and insert therefor -- defined --

Signed and Sealed this

Eleventh Day of June, 2002

Attest:

JAMES E. ROGAN
*Attesting Officer*          *Director of the United States Patent and Trademark Office*